(12) United States Patent  
Satake

(10) Patent No.: US 7,176,778 B1  
(45) Date of Patent: Feb. 13, 2007

(54) MAGNETIC CORE ASSEMBLY HAVING BOBBIN AND MOUNTING BOARD THEREOF

(75) Inventor: Yuki Satake, Tokyo (JP)

(73) Assignee: Sanshin Electric, Co., Ltd., Tokyo (JP)

( * ) Notice: Subject to any disclaimer, the term of this patent is extended or adjusted under 35 U.S.C. 154(b) by 0 days.

(21) Appl. No.: 11/240,126

(22) Filed: Sep. 30, 2005

(51) Int. Cl.
*H01F 27/30* (2006.01)

(52) U.S. Cl. .................................. 336/208; 336/83
(58) Field of Classification Search ................. 336/208
See application file for complete search history.

(56) References Cited

U.S. PATENT DOCUMENTS

| | | | | |
|---|---|---|---|---|
| 2,246,890 A | * | 6/1941 | Miller | 361/38 |
| 2,876,425 A | * | 3/1959 | Hampel | 336/198 |
| 3,052,859 A | * | 9/1962 | Bers | 336/131 |
| 4,504,812 A | * | 3/1985 | Moermond et al. | 336/84 C |
| 4,656,450 A | * | 4/1987 | Jarosz et al. | 336/83 |

* cited by examiner

*Primary Examiner*—Elvin Enad  
(74) *Attorney, Agent, or Firm*—Reising, Ethington, Barnes, Kisselle, P.C.

(57) ABSTRACT

A magnetic core assembly with coils therein has a substantially spherical or ellipsoidal main body defining a hollow space therein. A column is disposed in the main body so as to be aligned with a center line of the main body. The main body is defined by a pair of separated halves. The main body has a slot extending outward form the hollow space, and the slot aligns with a separating plane of the halves. The core assembly has a bobbin that is formed with a barrel wound by the coils, and the barrel has a through hole receiving the column of the core assembly. The bobbin has a retainer plate arranged with terminals for the coils. The retainer plate extends from the main body via the slot. A mounting board for the core assembly is formed with an opening to receive the spherical or ellipsoidal main core body such that the mounting board supports the core body on a periphery of the opening.

12 Claims, 4 Drawing Sheets

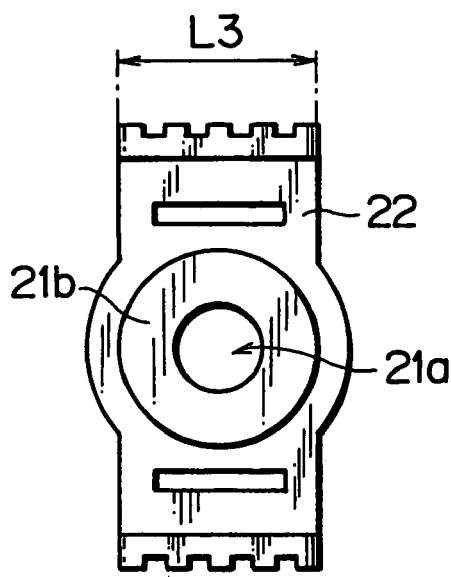
F I G. 3C
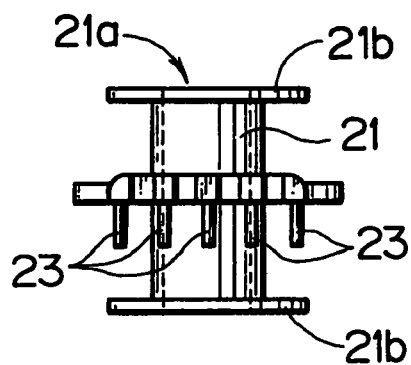
F I G. 3A
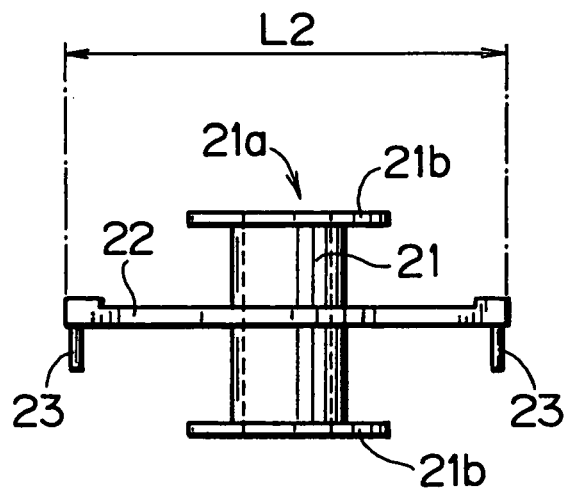
F I G. 3B
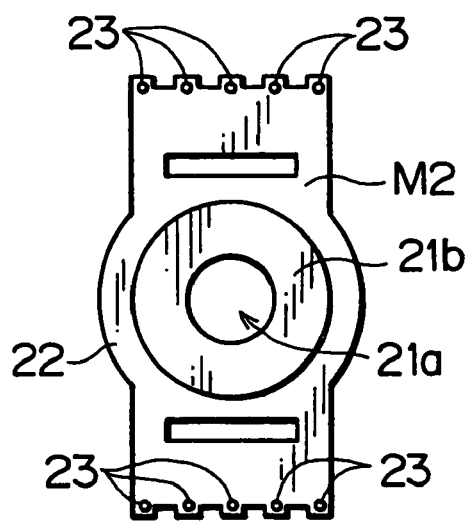
F I G. 3D

MAGNETIC CORE ASSEMBLY HAVING BOBBIN AND MOUNTING BOARD THEREOF

BACKGROUND OF THE INVENTION

1. Field of the Invention

The present invention relates to a magnetic core assembly used for a transformer or an electric motor, particularly to the magnetic core assembly having a bobbin and a mounting board thereof.

2. Related Art

A conventional transformer is shown in FIG. 7. As illustrated in the drawing, a transformer has a pair of cores 100 and a cylindrical bobbin 200. Each core 100 has an E-shaped section, and the bobbin 200 has a primary coil 301 and a secondary coil 302 which are wound thereon. The bobbin 200 has a through hole in which a central projection 101 of each of the E-shaped cores is inserted, so that the bobbin 200 is sandwiched between the E-shaped cores.

As shown in FIG. 7, the primary coil 301 and the secondary coil 302 generate magnetic flux L1 defining an ellipsoidal contour. The magnetic flux L1 is not along the cores 100, because the cores 100 have a rectangular shape. That is, the cores 100 have corners excessively sharp for the magnetic flux, at which the magnetic flux L1 partially expands outside cores 100. Furthermore, the cores 100 cover the coil bobbin 302 only partially, so that the magnetic flux L1 extends externally from the cores 100, decreasing efficiency in energy.

The leaked magnetic flux L1 generates radiant noises which may cause wrong operations of electronic circuits such as a switching circuit disposed near the transformer and a decreased power efficiency of the transformer itself. Such radiant noises are disadvantages to meet safety standards of EMC (Electromagnetic Compatibility) and EMI (Electromagnetic Interference) in respect of electric instruments having such transformers. Thus, some additional structures like a shield are necessary for circuits near the transformers so as to meet the standards of EMC and EMI. Accordingly, parts of the circuits increase in number to solve the noise problem and to meet the safety standards of EMC and EMI, increasing a manufacturing cost with an additional design work thereof.

In view of the foregoing situation, an object of the invention is to provide an improved magnetic core assembly, particularly a magnetic core assembly having a bobbin wound with coils and a mounting board for the core assembly. The magnetic core assembly can easily solve noise problems and decreases parts required for noise countermeasures, achieving a lower manufacturing cost including design thereof and an easy certification acquisition of the safety standards. Furthermore, the magnetic core assembly can improve power efficiency.

SUMMARY OF THE INVENTION

To achieve the foregoing object, an aspect of the present invention is a magnetic core assembly having coils wound thereon. The magnetic core assembly includes:

a substantially spherical or ellipsoidal main body that defines a hollow space therein, and a column disposed in the main body and extended from an inner surface of the main body into the hollow space to align with a center line of the main body, wherein the coils are arranged around the column.

Thus, the coils wound around the column generate magnetic flux along the substantially spherical or ellipsoidal core body. This accommodates the magnetic flux within the core body not to leak the magnetic flux outside the magnetic core assembly. Accordingly, the magnetic core assembly can easily solve noise problems for circuits positioned near the magnetic core assembly and decreases parts required for noise countermeasures, achieving a lower manufacturing cost including design thereof and an easy certification acquisition of safety standards. Furthermore, the magnetic core assembly can decrease electromagnetic losses caused by leak of magnetic flux, improving power efficiency.

Preferably, the main body with the column is defined by a pair of halves separated along a plane intersecting the column. Thus, the coils can be easily arranged around the column positioned in the hollow space, providing a lower cost in assembly thereof.

Preferably, the main body has a slot extending outward from the hollow space, the slot aligned with the separating plane of the halves. Thus, via the slot, each end of electrical wires defining the coils can be easily led out from the hollow space to the outside of the main body, providing a lower cost in assembling thereof.

Preferably, the magnetic core assembly further has a bobbin, wherein the bobbin has a barrel wound with the coils, and the barrel has a through hole for receiving the column. Thus, the bobbin is put on one of the separated halves of the main body, and then the other half covers the bobbin. This can easily attach the bobbin to the core body, providing a lower cost in assembling thereof.

Preferably, the bobbin has a retainer plate arranged with terminals for the coils, the retainer plate extended from the hollow space outward the main body via the slot. Thus, each end of the coils can be led outward from the hollow space through the slot, providing a lower cost in assembling thereof.

Preferably, the magnetic core assembly is combined with a mounting board formed with an opening in which the core body is inserted such that the mounting board can support the core body around a periphery of the opening. Thus, the core having the substantially spherical or ellipsoidal main body can be stably mounted on the mounting board.

BRIEF DESCRIPTION OF THE DRAWINGS

FIGS. 3A, 3B, 3C, and 3D each correspond sequentially to a front view, a side view, a top view, and a bottom view of a bobbin according to the present invention;

DETAILED DESCRIPTION OF PREFERRED EMBODIMENT

Figure 1:
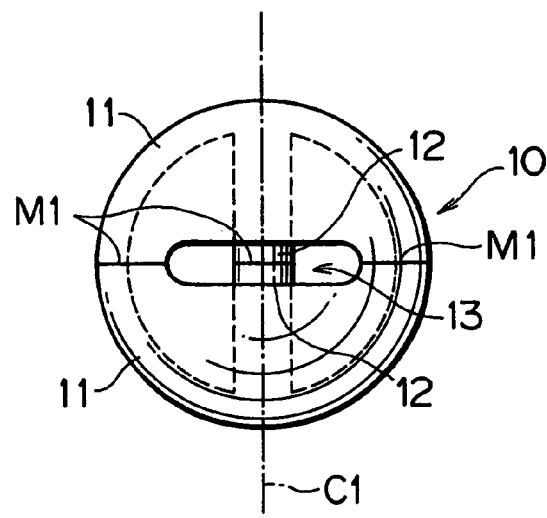
FIG. 1 is a front view showing an embodiment of a magnetic core assembly according to the present invention.

Referring to the accompanied drawings, a magnetic core assembly having a bobbin and a mounting board thereof according to the present invention will be discussed. A magnetic core assembly of an embodiment according to the present invention has a magnetic core 10 and a bobbin 20 as shown in FIG. 4. FIG. 1 is a front view showing the magnetic core 10. As illustrated in the drawing, the magnetic core 10 has a main spherical body 11 and a column 12. The main spherical body 11 defines a spherical hollow space 11a therein. The column 12 stands on an inner surface of the main body 11 so as to align with a center line C1 of the main body 11 and is positioned inside the hollow space 11a. The core 10 is made of ferrite powder, iron powder, permalloy molybdenum powder, a silicon steel plate, etc.

Figure 2A:
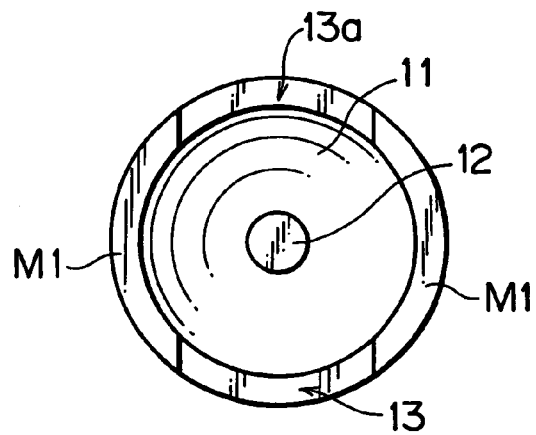
FIGS. 2A and 2B each sequentially show a top view or a front view of a lower half of a core main body.
Figure 2B:
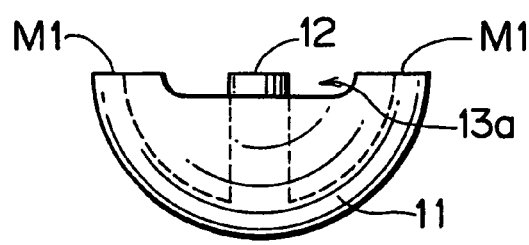

The main body 11 and the column 12 of the core assembly 10 are defined by a pair of halves separated by a separating plane M1. FIGS. 2A and 2B each sequentially show a top view or a front view of a lower half of the core assembly 10. A pair of slots 13 are defined by partially cutting the halves along the separating plane M1 to extend from the spherical hollow space 11a of the core assembly 10 toward the outside. Thereby as shown in FIG. 2B, each half of the core assembly 10 has a dent 13a along the separating plane M1.

Next, referring to FIGS. 3A, 3B, 3C, and 3D, a configuration of a bobbin having coils thereon and positioned around the column 12 of the core assembly 10 will be discussed. FIGS. 3A, 3B, 3C, and 3D each correspond sequentially to a front view, a side view, a top view, and a bottom view of the bobbin according to the present invention. As shown in the drawings, the bobbin 20 has a cylindrical barrel 21 for winding electrical wires thereon to define coils. The barrel 21 is formed with a through hole 21a receiving the column 12 of the core assembly 10.

The bobbin 20 has a flange 21b positioned at each top and bottom ends of the barrel 21 to prevent the wound coils from falling out of from the barrel 21.

The bobbin 20 is combined with a retainer plate 22 (terminal supporting portion) extending perpendicular to the barrel 21. The retainer plate 22 has a surface M2 that is parallel to the separating plane M1 of the core assembly 10 when the barrel 21 has engaged with the column 12 of the core assembly 10. The retainer plate 22 is positioned at the middle of the barrel 21 in an axial direction of the barrel 21. The retainer plate 22 has a longitudinal length L2 (FIG. 3B) longer than the diameter of the core assembly 10 and a lateral width L3 (FIG. 3C) shorter than the width of the slot 13. The retainer plate 22 is arranged with a plurality of terminals 23 projected therefrom at each longitudinal end of the surface M2.

Figures 4A, 4B:
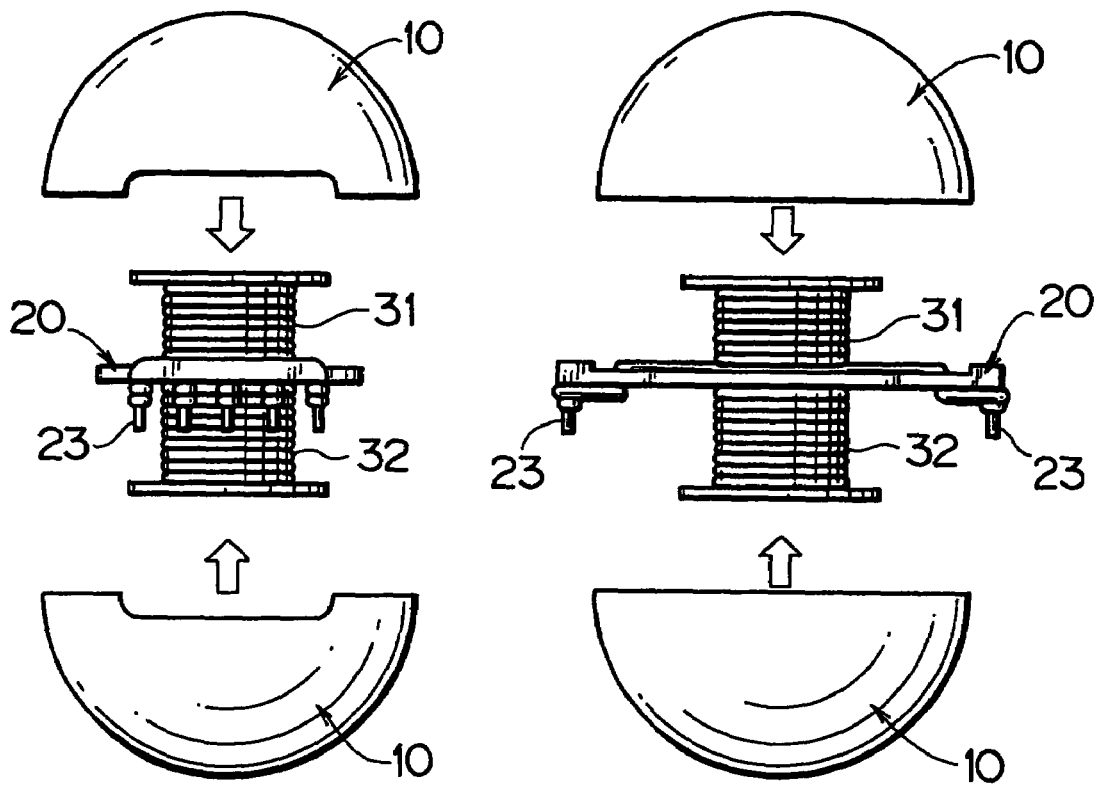
FIGS. 4A and 4B are explanatory views showing a process for attaching the bobbin of FIG. 3A to the core main body of the FIG. 1.
Figure 7:
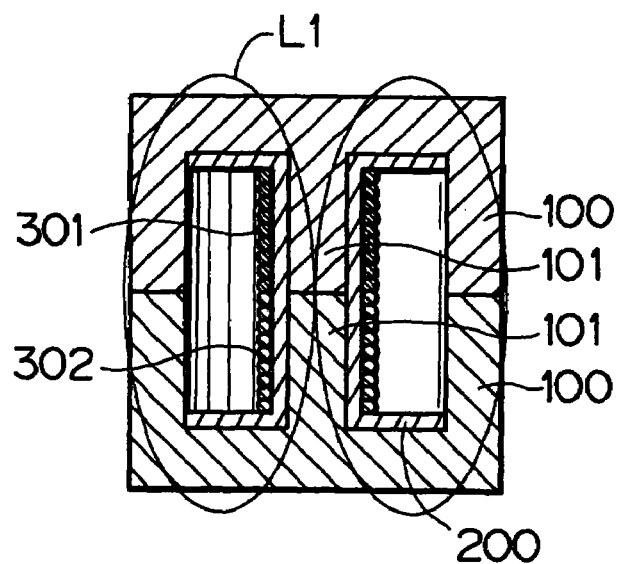
FIG. 7 is a conventional transformer having a core with a bobbin.

Next, referring to FIGS. 4A and 4B, a process of mounting thus configured bobbin 20 to the core assembly 10 will be discussed. First and second electrical wires are wound on the barrel 21 to define a primary coil 31 and a secondary coil 32. Then, a tape is wound on the primary and secondary coils 31, 32 to cover them. The bobbin 20 is dipped in an impregnant, and the bobbin 20 is heated to harden the impregnant. Thereby, the primary and secondary coils 31, 32 are secured to the barrel 21. Ends of the primary and secondary coils 31, 32 are electrically connected to the terminals 23 by soldering.

Then, the through hole 21a of the barrel 21 is engaged with the column 12 of the lower half of the core assembly 10, while the retainer plate 22 is received in the dent 13a of the slot 13. Next, the through hole 21a of the barrel 21 receives the column 12 of the upper half of the core assembly 10, while the retainer plate 22 is received in the other dent 13a of the slot 13. Thus, as shown in a sectional view of FIG. 5, the bobbin 20 is easily mounted on the column 12 of the core assembly 10, and the retainer plate 22 can be disposed in the slot 13 such that the terminals 23 are positioned outside the main body 11 of the core assembly 10.

Figure 5:
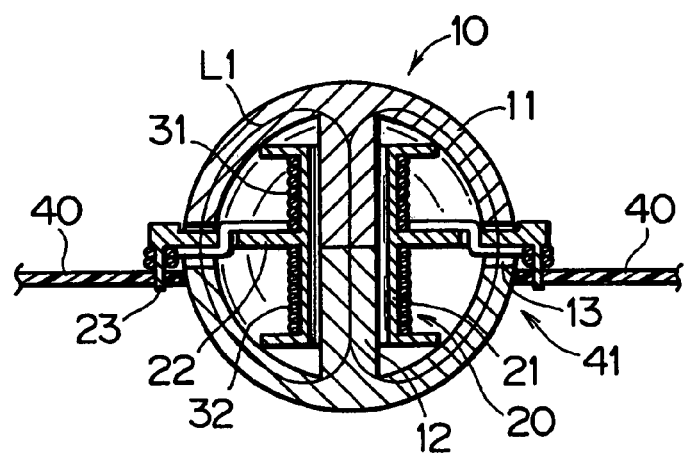
FIG. 5 is a sectional view showing a state in which the core assembled with the bobbin is disposed on a mounting board.

Thus configured core assembly 10 has the bobbin 20 fully covered by the upper and lower halves of main body 11 of the core assembly 10 to decrease the leak of magnetic flux L1. As shown in FIG. 5, the coils 31, 32 generate magnetic flux L1 along the upper and lower halves of the main body 11 and the column 12. Thus, the magnetic flux L1 is confined in the main core body 11, so that the magnetic flux L1 are prevented from leaking outside the main core body 11 of the core assembly 10, decreasing radiant noises derived therefrom.

Therefore, the magnetic core assembly can easily solve noise problems for circuits positioned near the magnetic core assembly and decreases parts required for noise countermeasures, achieving a lower manufacturing cost including design thereof and an easy certification acquisition of safety standards. Furthermore, the magnetic core assembly can decrease electromagnetic losses, improving power efficiency.

The core assembly 10 has the column 12 that is a straight core surrounded by the coils 31, 32 of the bobbin 20. Meanwhile, the main body 11 has an annular shape like a torodial core. Therefore, the core assembly 10 has induction characteristics derived from those of a straight core and a torodial core. The induction characteristics show inductance varying with increase of applied direct current.

Figure 6:
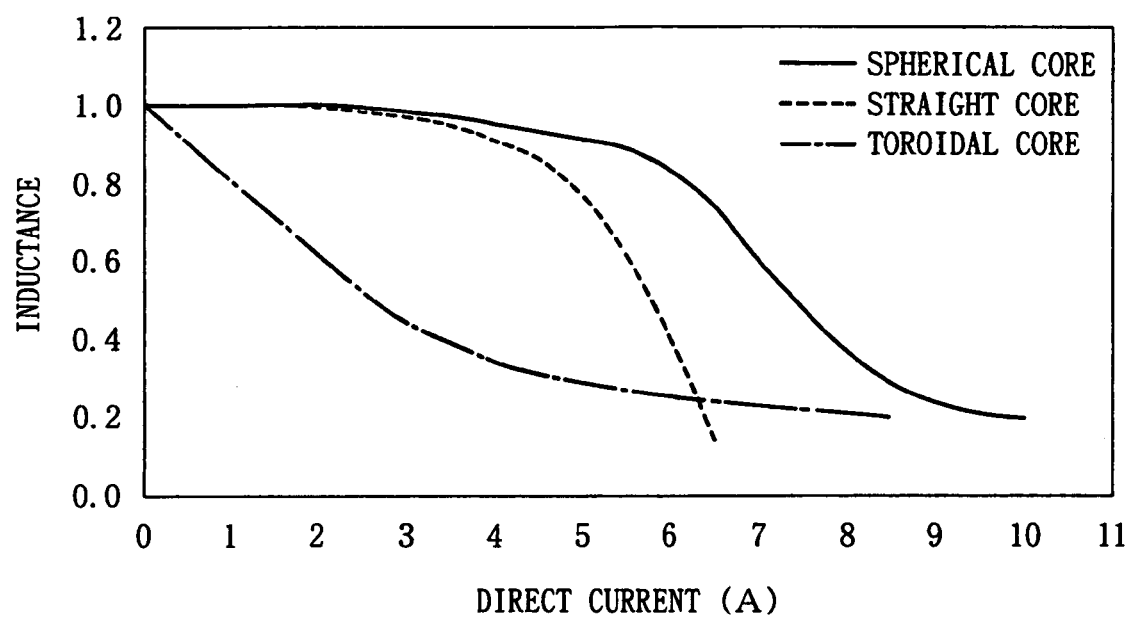
FIG. 6 is a graph showing induction characteristics of the core assembly of FIG. 1 in comparison with those of straight and toroidal cores.

Referring to FIG. 6, the induction characteristics will be discussed in detail. A general straight core has an induction characteristic curve A in which inductance decreases rapidly toward zero with applied current beyond a value. Meanwhile, a torodial core has an induction characteristic curve B in which inductance gradually decreases with increase of current until the inductance becomes a constant value over a current value. The foregoing core assembly 10 has an induction characteristic curve C that is a combination of the induction characteristic curve A of the straight core and the induction characteristic curve B of the toroidal curve.

The core assembly 10 has the advantageous induction characteristics in which inductance becomes a content value higher than that of the toroidal core in a larger current region. Thus, the core assembly 10 is not damaged even when a larger current is applied due to a rapid load change, which is suitable, for example, for a small motor with a comparatively larger torque for a robot.

Furthermore, the core assembly 10 is decreased in radiant noise so that the core assembly 10 is suitable for a transformer and a motor, for example, of a medical or care robot that does not generate noises which cause wrong operations of electronic instruments positioned around the core assembly 10.

The main body 11 of the core assembly 10 is defined by the pair of halves separated along the plane M1 intersecting the column 12. Thus, the bobbin 20 wound with the coils 31, 32 can be easily arranged on the column 12 positioned within the main core body 11.

The magnetic core assembly 10 has the slot 13 extending outward from the hollow space, the slot formed so as to align with the separating plane M1 of the core halves. Thus, via the slot 13, each end of electrical wires defining the coils 31, 32 can be easily led out from core assembly 10.

Next, a mounting board 40 for the core assembly 10 will be discussed. As shown in FIG. 5, the mounting board 40 has a substantially circular opening 41. The opening 41 receives the core assembly 10 such that the lower half of the core main body 11 is supported by a periphery of the opening 41. Thus, the core assembly 10 having the spherical shape can be stably positioned on the mounting board 40.

In the discussed embodiment, the core assembly 10 has a substantially spherical outer shape. The core assembly 10 may be ellipsoidal in conformity with magnetic flux L1 generated by the coils 31, 32 of the core assembly 10.

The mounting board 40 shall have an oval opening 41 when the core assembly has an outer oval shape.

What is claimed is:

1. A magnetic core assembly having coils therein, comprising:
   a substantially spherical or ellipsoidal main body defining a hollow space therein, the main body defining a main body core, and
   a column disposed in the main body and aligned with a center line of the main body, the column defining a column core and extended between opposed inner surfaces of the main body unitarily with the main body,
   wherein the main body and the column are divided by a dividing plane intersecting the center line of the main body into a pair of halves.

2. The magnetic core assembly recited in claim 1, wherein the main body has a slot extending outward from the hollow space, the slot aligned with the dividing plane of the pair of halves.

3. The magnetic core assembly recited in claim 1, further comprising a bobbin, wherein the bobbin has a barrel wound with the coils, and the barrel has a through hole for receiving the column.

4. The magnetic core assembly recited in claim 2 further comprising a retainer plate arranged with terminals for the coils, the retainer plate being substantially parallel to the dividing plane of the pair of halves, the retainer plate extended from the hollow space outside the main body via the slot.

5. Combination of the magnetic core assembly recited in claim 1 and a mounting board, wherein the mounting board is formed with an opening, and the main body is supported by a periphery of the opening.

6. The magnetic core assembly recited in claim 1, wherein the main body and the column are made of any one of ferrite powder, iron powder, permalloy molybdenum powder, and a silicon steel plate.

7. A core assembly used with coils, comprising:
   a substantially spherical or ellipsoidal main body defining a hollow space therein, the main body providing a main body core, and
   a column disposed in the main body and aligned with a center line of the main body, the column defining a column core and extended between opposed inner surfaces of the main body unitarily with the main body,
   wherein the main body and the column are divided by a dividing plane intersecting the center line of the main body in a pair of halves.

8. The core assembly recited in claim 7, wherein the main body has a slot extending outward from the hollow space, the slot aligned with the dividing plane of the halves.

9. The core assembly recited in claim 7, further comprising a bobbin, wherein the bobbin has a barrel wound with the coils, and the barrel has a through hole for receiving the column of the core assembly.

10. The core assembly recited in claim 8 further comprising a retainer plate arranged with terminals for the coils, the retainer plate being substantially parallel to the dividing plane of the pair of halves, the retainer plate extended from the hollow space outside the main body via the slot.

11. The core assembly recited in claim 7, wherein the main body and the column are made of any one of ferrite powder, iron powder, permalloy molybdenum powder, and a silicon steel plate.

12. Combination of the core assembly recited in claim 7 and a mounting board, wherein the mounting board is formed with an opening, and the core assembly is supported by a periphery of the opening.

* * * * *